United States Patent
Singh et al.

(10) Patent No.: US 12,516,805 B2
(45) Date of Patent: Jan. 6, 2026

(54) PARALELL PLATE HIGH-LUMEN LUMINAIRE

(71) Applicant: SIGNIFY HOLDING B.V., Eindhoven (NL)

(72) Inventors: Suprabh Singh, Oxford, MS (US); Robert Joseph Riffel, Saltillo, MS (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/293,341

(22) PCT Filed: Jul. 28, 2022

(86) PCT No.: PCT/EP2022/071175
§ 371 (c)(1),
(2) Date: Dec. 10, 2024

(87) PCT Pub. No.: WO2023/006866
PCT Pub. Date: Feb. 2, 2023

(65) Prior Publication Data
US 2025/0137634 A1 May 1, 2025

Related U.S. Application Data

(60) Provisional application No. 63/226,867, filed on Jul. 29, 2021.

(30) Foreign Application Priority Data

Aug. 9, 2021 (EP) ..................................... 21190260

(51) Int. Cl.
F21V 29/10 (2015.01)
F21V 7/04 (2006.01)
(Continued)

(52) U.S. Cl.
CPC ............ *F21V 29/10* (2015.01); *F21V 23/005* (2013.01); *H05K 7/20127* (2013.01); *F21V 7/04* (2013.01);
(Continued)

(58) Field of Classification Search
CPC .......... F21S 8/04–068; F21V 7/005–09; F21V 29/10; F21V 29/85; F21W 2131/402;
(Continued)

(56) References Cited

U.S. PATENT DOCUMENTS 8,186,855 B2 * 5/2012 Wassel ..................... F21K 9/90
362/249.02
8,721,114 B2 5/2014 Wassel et al.
(Continued)

FOREIGN PATENT DOCUMENTS

EP 3159607 A1 4/2017

*Primary Examiner* — Jason M Han

(57) ABSTRACT

A lighting apparatus (100), comprising: a set of a first and second vertical plates (102, 104) arranged in parallel and perpendicular to the ground (200) and separated by an optimized distance (106); first and second light arrays (108, 110) arranged on the exterior sides of the first and second vertical plates (102, 104); first and second reflectors (112, 114) arranged around the first and second light arrays (108, 110); first and second driver plates (116, 118) arranged in parallel on the exterior sides of the first and second vertical plates (102, 104); a first driver (120) arranged on the first driver plate (116), wherein the first driver (120) is electrically coupled to the first light array (108); and a second driver (122) arranged on the second driver plate (118), wherein the second driver (122) is electrically coupled to the second light array (110).

13 Claims, 7 Drawing Sheets

(51) Int. Cl.
    *F21V 23/00*         (2015.01)
    *F21Y 103/10*       (2016.01)
    *F21Y 115/10*       (2016.01)
    *H05K 7/20*          (2006.01)

(52) U.S. Cl.
    CPC ....... *F21Y 2103/10* (2016.08); *F21Y 2115/10* (2016.08)

(58) Field of Classification Search
    CPC ............. F21Y 2103/10; F21Y 2105/16; F21Y 2115/10; H05K 7/20127
    See application file for complete search history.

(56) References Cited

U.S. PATENT DOCUMENTS

| | | |
|---|---|---|
| 9,253,848 B2 | 2/2016 | Hayman et al. |
| 2015/0300624 A1 | 10/2015 | Favarolo et al. |
| 2016/0102845 A1 | 4/2016 | Scribante et al. |
| 2017/0227208 A1 | 8/2017 | Bendtsen et al. |

* cited by examiner

PARALELL PLATE HIGH-LUMEN LUMINAIRE

CROSS-REFERENCE TO PRIOR APPLICATIONS

This application is the U.S. National Phase application under 35 U.S.C. § 371 of International Application No. PCT/EP2022/071175, filed on Jul. 28, 2022, which claims the benefit of European Patent application Ser. No. 21190,260.6, filed on Aug. 9, 2021, and U.S. Provisional Application No. 63/226,867, filed on Jul. 29, 2021. These applications are hereby incorporated by reference herein.

FIELD OF THE DISCLOSURE

The present disclosure is directed generally to high-lumen luminaires.

BACKGROUND

Existing high-lumen luminaires face significant thermal challenges. These high-lumen luminaires are often implemented as high bay luminaires, and are configured to illuminate spaces with high ceilings, such as between 20 and 45 feet. These spaces are often in large industrial, warehouse, or commercial buildings. Illuminating these spaces demands a high level of light, sometimes requiring these luminaires to emit up to 72,000 lumens in certain applications. Generating this high amount of light is possible due to modern light emitting diodes (LEDs). However, this high amount of light also generates a high level of heat. This heat can reduce the lifetime of the luminaires when operating at elevated temperatures for prolonged periods of time. Existing high bay luminaires are often bulky and require large diecast heatsink components. Further, in certain arrangements and configurations, the existing high-lumen luminaires are also challenged to distribute the generated light in an effective manner. Accordingly, there is a need in the art for improved high lumen luminaires for dissipating heat while effectively distributing the generated light.

U.S. Pat. No. 9,253,848 discloses an LED lighting system, which generally consists of an enclosure, one or more LED modules, one or more transformers, and one or more drivers. A lamp assembly is disclosed, which generally consists of one or more vertically oriented LED chips, thermally conductive shells, and a thermally dissipating means positioned at the back of the LED chips. An LED module is disclosed, which generally consists of a lamp assembly, one or more reflectors and modules caps. A method of controlling light intensities is disclosed, which generally consists of method of decreasing light intensities in areas with little occupancy while minimizing user annoyance resulting from drastic light intensity fluctuations. A universal mounting bracket is disclosed, which generally consists of a fixture plate, mounting plate, and an adjustable means.

SUMMARY OF THE DISCLOSURE

The present disclosure is generally directed to a lighting apparatus configured to improve heat dissipation through free convection. The lighting apparatus includes a set of parallel vertical plates, a light array arranged on each parallel plate, and a reflector arranged around each light array. The parallel plates are separated by an optimized distance for free convection between the plates. The reflectors are configured to redirect light produced by the light arrays downward relative to the lighting apparatus.

Each of the parallel vertical plates is arranged approximately perpendicular to the ground of the area illuminated by the lighting apparatus. In certain arrangements, the optimized distance is approximately 0.6 inches. The light arrays are arranged on the exterior faces of the parallel vertical plates. Each of the light arrays include a plurality of light emitting diodes (LEDs). A reflector is affixed to each parallel plate. Each reflector is arranged around the light array of the corresponding parallel plate to direct at least a portion of the light towards the ground. Each light array is powered and controlled by a driver. The drivers are arranged on driver plates, which are arranged in parallel with the parallel vertical plates.

Generally, in one aspect, a lighting apparatus is provided. The lighting apparatus includes a first vertical plate. The first vertical plate is arranged perpendicular to ground.

The lighting apparatus further includes a second vertical plate. The second vertical plate is arranged in parallel with the first vertical plate. The second vertical plate is separated from the first vertical plate by an optimized distance. In one example, the optimized distance is approximately 0.6 inches. In another example, the optimized distance between the first vertical plate and second vertical plate optimizes free convection within the lighting apparatus when the lighting apparatus has a temperature between 45° Celsius and 65° Celsius. According to a further example, the first vertical plate and the second vertical plate are each approximately 2 feet long. According to an even further example, the first vertical plate and the second vertical plate are steel.

The lighting apparatus further includes a first light array. The first light array is arranged on the first vertical plate. According to an example, the first light array is arranged on a first side of the first vertical plate. The first side faces away from the second vertical plate. According to an even further example, the first light array comprises a plurality of LEDs.

The lighting apparatus further includes a second light array. The second light array is arranged on the second vertical plate. According to an example, the second light array is arranged on a first side of the second vertical plate. The first side faces away from the first vertical plate. According to a further example, first light array and the second light array emit between 8,000 and 72,000 lumens in total. According to an even further example, the first light array and the second light array generate approximately equivalent quantities of visible light.

The lighting apparatus further includes a first reflector. The first reflector is arranged around the first light array. According to an example, the first reflector is configured to direct at least a portion of light generated by the first light array toward the ground.

The lighting apparatus further includes a second reflector. The second reflector is arranged around the second light array. According to an example, the first reflector and the second reflector are circular or elliptical.

According to an example, the lighting apparatus further includes a first driver plate. The first driver plate is arranged in parallel with the first vertical plate. The lighting apparatus further includes a second driver plate. The second driver plate is arranged in parallel with the second vertical plate. The lighting apparatus further includes a first driver. The first driver is arranged on the first driver plate. The first driver is electrically coupled to the first light array. The lighting apparatus further includes a second driver. The second driver is arranged on the second driver plate. The second driver is electrically coupled to the second light array.

According to an example, the first driver is electrically coupled to the first light array via one or more driver cables. According to a further example, the one or more driver cables are covered by braided-shielding.

Generally, in another aspect, a lighting apparatus is provided. The lighting apparatus includes a first vertical plate. The first vertical plate is arranged perpendicular to ground. The lighting apparatus further includes a second vertical plate. The second vertical plate is arranged in parallel with the first vertical plate. The second vertical plate is separated from the first vertical plate by an optimized distance.

The lighting apparatus further includes a first light array. The first light array is arranged on a first light plate. The lighting apparatus further includes a second light array. The second light array is arranged on a second light plate.

The lighting apparatus further includes a first reflector. The first reflector is arranged around the first light array. The lighting apparatus further includes a second reflector. The second reflector is arranged around the second light array.

The lighting apparatus further includes a first driver. The first driver is arranged on the first vertical plate. The first driver is electrically coupled to the first light array. The lighting apparatus further includes a second driver. The second driver is arranged on the second vertical plate. The second driver is electrically coupled to the second light array.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

These and other aspects of the various embodiments will be apparent from and elucidated with reference to the embodiment(s) described hereinafter.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various embodiments.

DETAILED DESCRIPTION OF EMBODIMENTS

Figure 1:
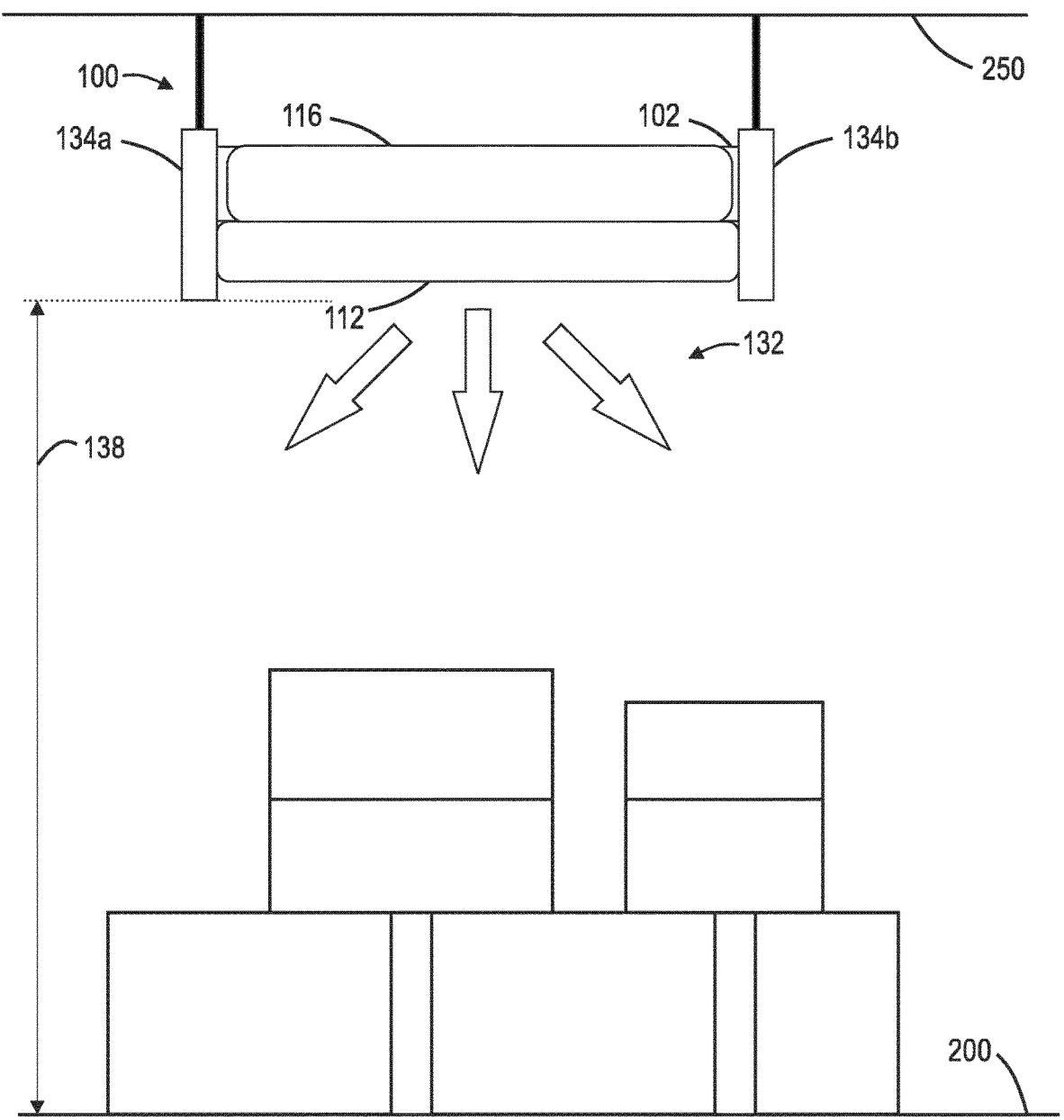
FIG. 1 is an illustration of a lighting apparatus in a warehouse environment, in accordance with an example.

The present disclosure is generally directed to a lighting apparatus configured to improve heat dissipation through free convection. The lighting apparatus includes a set of parallel vertical plates, a light array arranged on each parallel plate, and a reflector arranged around each light array. The parallel plates are separated by an optimized distance for free convection between the plates. The reflectors are configured to redirect light produced by the light arrays downward relative to the lighting apparatus. By directing the light downward, the lighting apparatus may be used as a high bay light in industrial, commercial, and/or warehouse settings. The high-lumen nature of the lighting apparatus enables the apparatus to sufficiently illuminate the aforementioned settings, while using the air flow resulting from free convection to prevent the apparatus from overheating. This air flow creates a "chimney-effect" which sucks ambient air into the bottom of the parallel vertical plate arrangement, and expels hot air out of the top.

Each of the parallel vertical plates is arranged approximately perpendicular to the ground of the area illuminated by the lighting apparatus. The parallel vertical plates may be steel or aluminum sheet metal. Each of the parallel plates may be approximately 2 feet long and 1.5 inches thick, resulting in a lighting apparatus significantly more compact than existing high-lumen high bay luminaires. The optimized distance between the parallel plates can be determined by virtual modelling and/or experimental testing. In certain arrangements, the optimized distance is approximately 0.6 inches. In other arrangements, the optimized distance is determined to optimize free convection when the lighting apparatus has a temperature between 45 degrees Celsius and 65 degrees Celsius. In even further arrangements, the parallel vertical plates are coated with a polyester paint to improve the radiative qualities of the plates.

The light arrays are arranged on the exterior faces of the parallel vertical plates. Each of the light arrays include a plurality of light emitting diodes (LEDs), such as an LED bar. In certain configurations, the light arrays generate between 8,000 and 72,000 lumens in total, with each light array generating approximately the same amount of light. A reflector is affixed to each parallel plate. Each reflector is arranged around the light array of the corresponding parallel plate to direct at least a portion of the light towards the ground. The reflectors can be circular or elliptical, and made of polished anodized aluminum.

Each light array is powered and controlled by a driver. The drivers are arranged on driver plates, which are arranged in parallel with the parallel vertical plates. The drivers may be electrically coupled to the light arrays via driver cables, such as driver cables covered by glass-covered braided-shielding. Mounting the drivers on plates separate from the parallel vertical plates further improves heat dissipation, and enables air flow between the driver plates and the parallel vertical plates. Depending on the implementation, the driver plates may be mounted to the vertical parallel plates or to an end cap.

FIG. 1 shows an example lighting apparatus 100 in an industrial warehouse environment. In this environment, the lighting apparatus 100 is implemented as a high-lumen, high bay luminaire configured to illuminate the ground 200 (or floor) of the warehouse. The lighting apparatus 100 is suspended from the ceiling 250 of the warehouse via a pair of end caps 134a, 134b. In this example, the distance 138 between the lighting apparatus 100 and the ground 200 can be between 20 feet and 40 feet. In order to illuminate the ground 200, the lighting apparatus 100 generates a high level of light 132, such as between 8,000 and 72,000 lumens. First reflector 112 directs at least a portion of the light 132 down towards the ground 200. This high lumen output can cause the lighting apparatus 100 to heat up to between 45 degrees Celsius and 65 degrees Celsius, requiring significant heat dissipation to prevent damage to the components of the apparatus 100.

As shown in FIG. 1, the lighting apparatus includes a first vertical plate 102 arranged perpendicular to the ground 200. The first vertical plate 102 is affixed to the end caps 134a, 134b. A first driver plate 116 is affixed to the first vertical plate 102 to support a first driver 120 (not shown). The first driver plate 116 is arranged in parallel with the first driver plate 102. Reflector 112 is also affixed to the first vertical plate 102.

Figure 2:
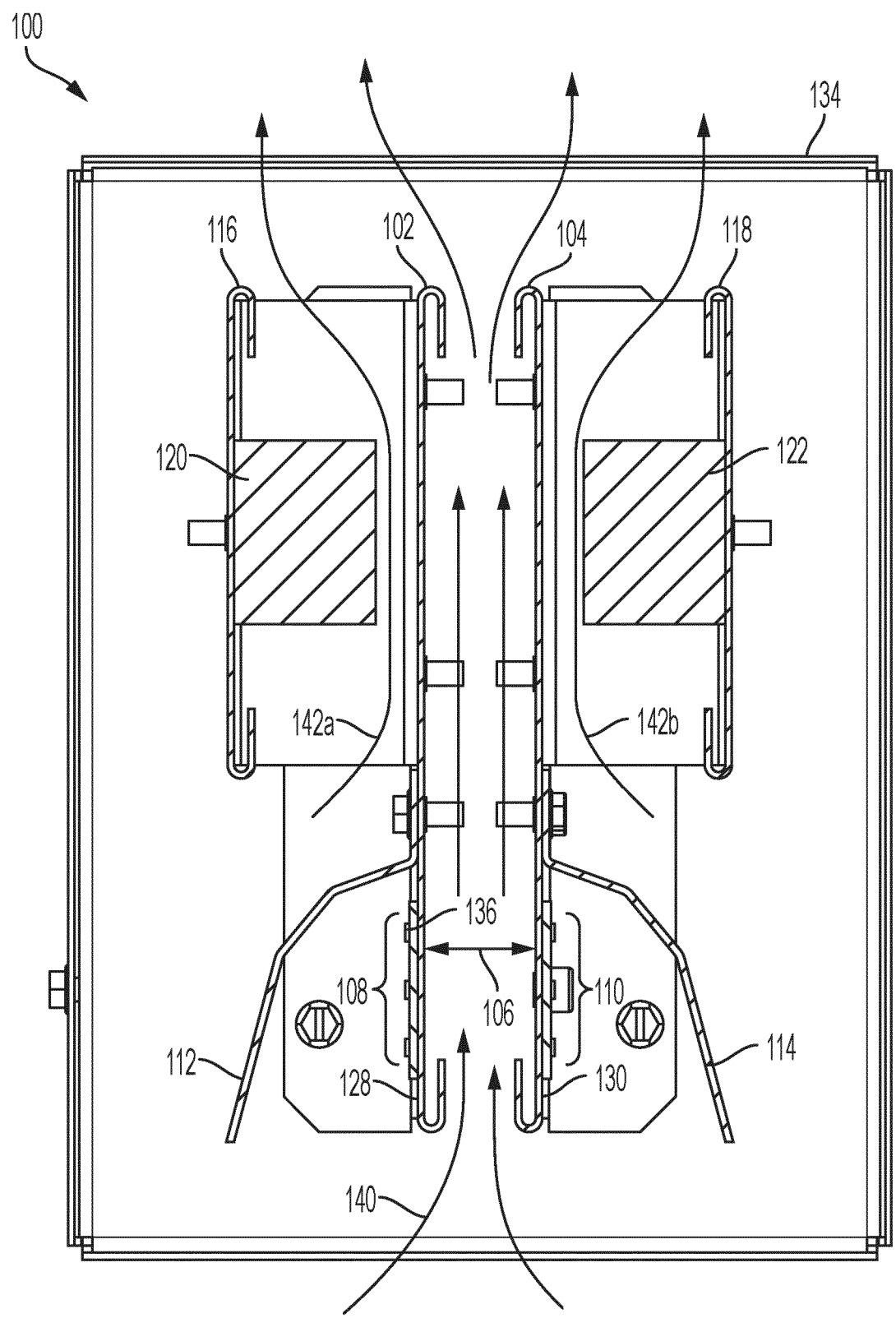
FIG. 2 is a cross-sectional view of a lighting apparatus, in accordance with an example.

FIG. 2 shows a cross-sectional view of a lighting apparatus 100 from the perspective of end cap 134. This cross-sectional view illustrates the "chimney effect" created by the free convection within the lighting apparatus 100. The "chimney-effect" dissipates heat by sucking ambient air into the bottom of the lighting apparatus, and expelling hot air out of the top.

As shown in FIG. 2, the lighting apparatus 100 includes a first vertical plate 102. The first vertical plate 102 is arranged perpendicular to both ground 200 and end cap 134. The first vertical plate 102 may be affixed to the end cap 134.

The lighting apparatus 100 further includes a second vertical plate 104. As shown in FIG. 2, the second vertical plate 104 is arranged in parallel with the first vertical plate 102. Accordingly, the second vertical plate 104 is also perpendicular to the ground 200 and the end cap 134. The second vertical plate 104 may also be affixed to the end cap 134.

For maximized heat dissipation, the second vertical plate 104 is separated from the first vertical plate 102 by an optimized distance 106. This optimized distance 106 allows for free convection between the first vertical plate 102 and the second vertical plate 104. The optimized distance 106 may be determined by virtual modelling and/or experimental testing. In one example, the optimized distance 106 is approximately 0.6 inches. In another example, the optimized distance 106 between the first vertical plate 102 and the second vertical plate 104 optimizes free convection within the lighting apparatus 100 when the lighting apparatus 100 has a temperature between 45° Celsius and 65° Celsius. Main air flow 140 shows how free convection enables the flow of ambient air from below the lighting apparatus 100, to between the first vertical plate 102 and the second parallel plate 104, to out of the top of the lighting apparatus 100 as hot air.

In some examples, the first vertical plate 102 and the second vertical plate 104 are each approximately 2 feet long. The first vertical plate 102 and the second vertical plate 104 may also be approximately 1.5 inches thick. These dimensions result in a lighting apparatus 100 significantly more compact than existing high-lumen, high bay luminaires. According to an even further example, the first vertical plate 102 and the second vertical plate 104 are steel or aluminum sheet metal. In even further examples, the first vertical plate 102 and the second vertical plate 104 are coated with a polyester paint to improve the radiative qualities of the plates 102, 104.

In further examples, the first vertical plate 102 and/or the second vertical plate 104 may have bends and/or patterns to increase structural rigidity. In additional examples, the first vertical plate 102 and/or the second vertical plate 104 may have one or more holes, punches, and/or perforations to enhance air flow and cooling.

In further examples, the lighting apparatus 100 may include one or more additional parallel plates used to enhance cooling. For example, an additional parallel plate may be arranged between, and parallel with, the first vertical plate 102 and the second vertical plate 104. The additional parallel plate may be affixed to the first vertical plate 102 and/or the second vertical plate 104 via one or more standoffs or spacers. The standoffs or spacers are made of a heating conductive material, such as steel, thus increasing the surface area of the heat dissipating components of the lighting apparatus 100. Multiple additional parallel plates may be used, depending on the application. In a further examples, the lighting apparatus 100 may include one or more additional parallel plates to mount lighting accessories or other components.

With further reference to FIG. 2, the lighting apparatus 100 further includes a first light array 108. The first light array 108 arranged on a first side 128 of the first vertical plate 102. The first side 128 faces away from the second vertical plate 104. In this example, the first light array 108 includes three rows of LEDs 136.

The lighting apparatus 100 further includes a second light array 110. The second light array 110 is arranged on the second vertical plate 104. According to an example, the second light array 110 is arranged on a first side 130 of the second vertical plate 104. The first side 130 faces away from the first vertical plate 102. In this example, the first light array 108 and the second light array 110 generate approximately equivalent quantities of visible light. In other examples, one of the light arrays 108, 110 may generate more light than the other, due to either variations in the type or quantity of LEDs 136, or variations control and/or power signals applied to the arrays 108, 110 or their corresponding drivers 120, 122.

With further reference to FIG. 2, the lighting apparatus 100 further includes a first reflector 112. The first reflector 112 is affixed to the first vertical plate 102 and is arranged around the first light array 108. Accordingly, the first reflector 112 is configured to direct at least a portion of light 132 generated by the first light array 108 toward the ground 200.

The lighting apparatus 100 further includes a second reflector 114. The second reflector 114 is affixed to the second vertical plate 104 and is arranged around the second light array 110. As with the first reflector 112, the second reflector 114 is configured to direct at least a portion of light 132 generated by the second light array 110 toward the ground 200. Without the reflectors 112, 114, a significant portion of the light 132 generated by the light arrays 108, 110 would not reach the ground 200. The LEDs 136 of the light arrays 108, 110 face parallel to the ground 200, and the lighting apparatus is arranged in a high bay configuration 20 feet to 40 feet off the ground 200. Accordingly, the reflectors 112, 114 are required to direct the light 132 to the ground 200 for sufficient illumination of the industrial, commercial, or warehouse environment.

In the example of FIG. 2, the first reflector 112 and the second reflector 114 are elliptical. In other examples, the first reflector 112 and the second reflector 114 may be configured as other shapes, such as circular. The first reflector 112 and the second reflector 114 may be made of polished anodized aluminum.

With further reference to FIG. 2, the lighting apparatus 100 further includes a first driver plate 116. The first driver plate 116 is arranged in parallel with the first vertical plate 102. The lighting apparatus 100 further includes a first driver 120. The first driver 120 is arranged on the first driver plate 116. The first driver 120 is electrically coupled to the first light array 108. The first driver 120 is configured to provide the first light array 108 with driver signals to dictate the illumination (on/off status, brightness, etc.) of the first light array 108. In the example of FIG. 2, the first driver plate 116 is affixed to end cap 134. In further examples, a small portion of the first driver plate 116 can be affixed to first vertical plate 102 such that the first driver 120 is isolated from the first vertical plate 102.

The lighting apparatus 100 further includes a second driver plate 118. The second driver plate 118 is arranged in parallel with the second vertical plate 104. The lighting apparatus 100 further includes a second driver 122. The second driver 122 is arranged on the second driver plate 118. The second driver 122 is electrically coupled to the second light array 110. The second driver 122 is configured to provide the second light array 110 with driver signals to dictate the illumination of the second light array 110. In the example of FIG. 2, the second driver plate 118 is affixed to end cap 134. In further examples, a small portion of the second driver plate 118 can be affixed to second vertical plate 104 such that the second driver 122 is isolated from the second vertical plate 104.

In the example of FIG. 2, the first driver plate 116 and the second driver plate 118 are each affixed to the end cap 134. This arrangement enables a first driver air flow 142a between the first driver 120 and the first vertical plate 102, and a second driver air flow 142 between the second driver 122 and the second driver plate 104. This air flow 142a, 142b between the drivers 120, 122 and vertical plates 102, 104 further improves heat dissipation within the lighting apparatus 100.

In further examples, the first driver plate 116 and/or the second driver plate 118 may have bends and/or patterns to increase structural rigidity. In additional examples, the first driver plate 116 and/or the second driver plate 118 may have one or more holes, punches, and/or perforations to enhance air flow and cooling.

According to an example, the first driver 120 is electrically coupled to the first light array 108 via one or more driver cables 124 (not shown). The second driver 122 may be similarly coupled to the second light array 108. According to a further example, the one or more driver cables 124 are covered by braided-shielding 126, such as glass shielding.

In an alternate example to the lighting apparatus 100 shown in FIG. 2, the first vertical plate 102 and the second vertical plate 104 are not arranged as approximately perpendicular to each other. Instead, the first vertical plate 102 and the second vertical plate 104 may be arranged at an angle relative to each other. While angling the vertical plates 102, 104 will likely decrease the rate of heat dissipation of the lighting apparatus 100, it will likely increase the amount of light 132 which is directed towards ground 200. Thus, in cases where additional light 132 is desired and dissipating heat is a less critical requirement, it may be advantageous to slightly angle the first vertical plate 102 and the second vertical plate 104 relative to each other.

Figure 3:
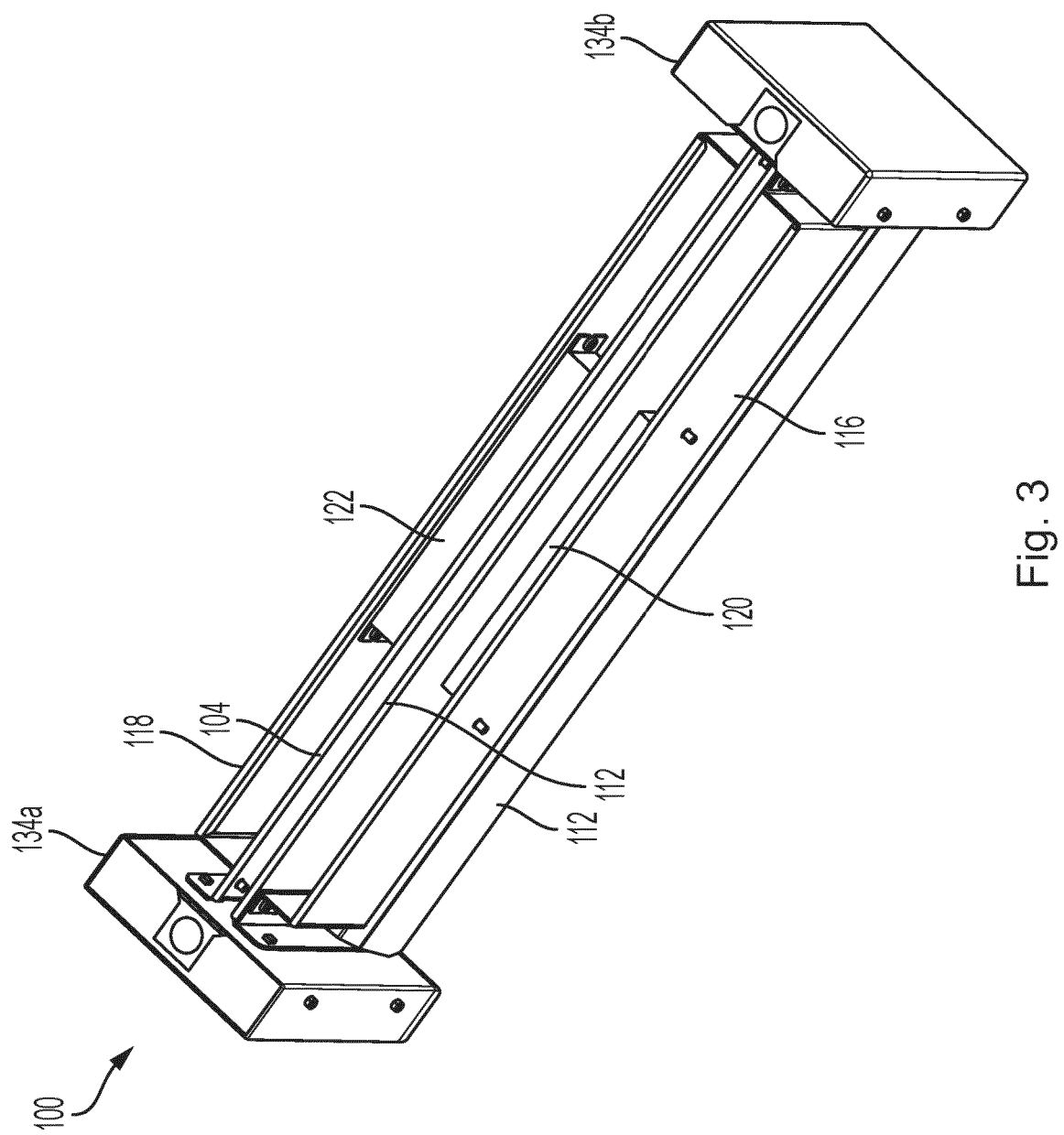
FIG. 3 is an isometric top view of a lighting apparatus, in accordance with an example.

FIG. 3 shows an isometric top view of the lighting apparatus 100. FIG. 3 shows the first vertical plate 102 and the second vertical plate 104 each affixed to the end caps 134a, 134b via one or more screws, rivets, or other mechanical fasteners. The first driver plate 116 is affixed to the first vertical plate 102, while the second driver plate 118 is affixed to the second vertical plate 104. The first driver 120 is affixed to the first driver plate 116, while the second driver 122 is affixed to the second driver plate 118. The first reflector 112 is affixed to the first vertical plate 102.

Figure 4:
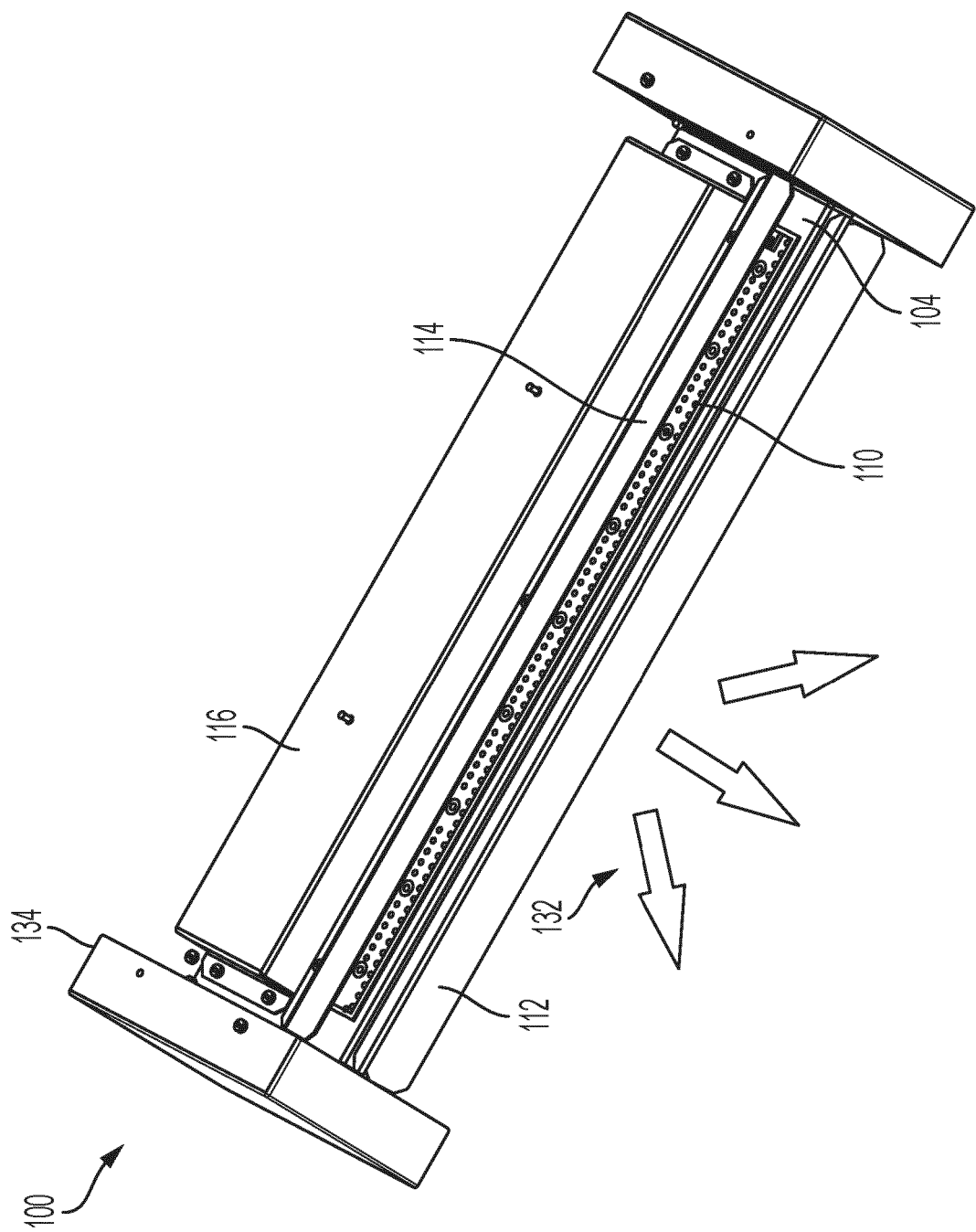
FIG. 4 is an isometric bottom view of a lighting apparatus, in accordance with an example.

FIG. 4 shows an isometric top view of the lighting apparatus 100. FIG. 4 shows a second light array 110 affixed to second vertical plate 104. Second reflector 114 is affixed to the second vertical plate 104. The second reflector 114 directs light 132 generated by the second light array 110 downward towards ground 200.

Figure 5:
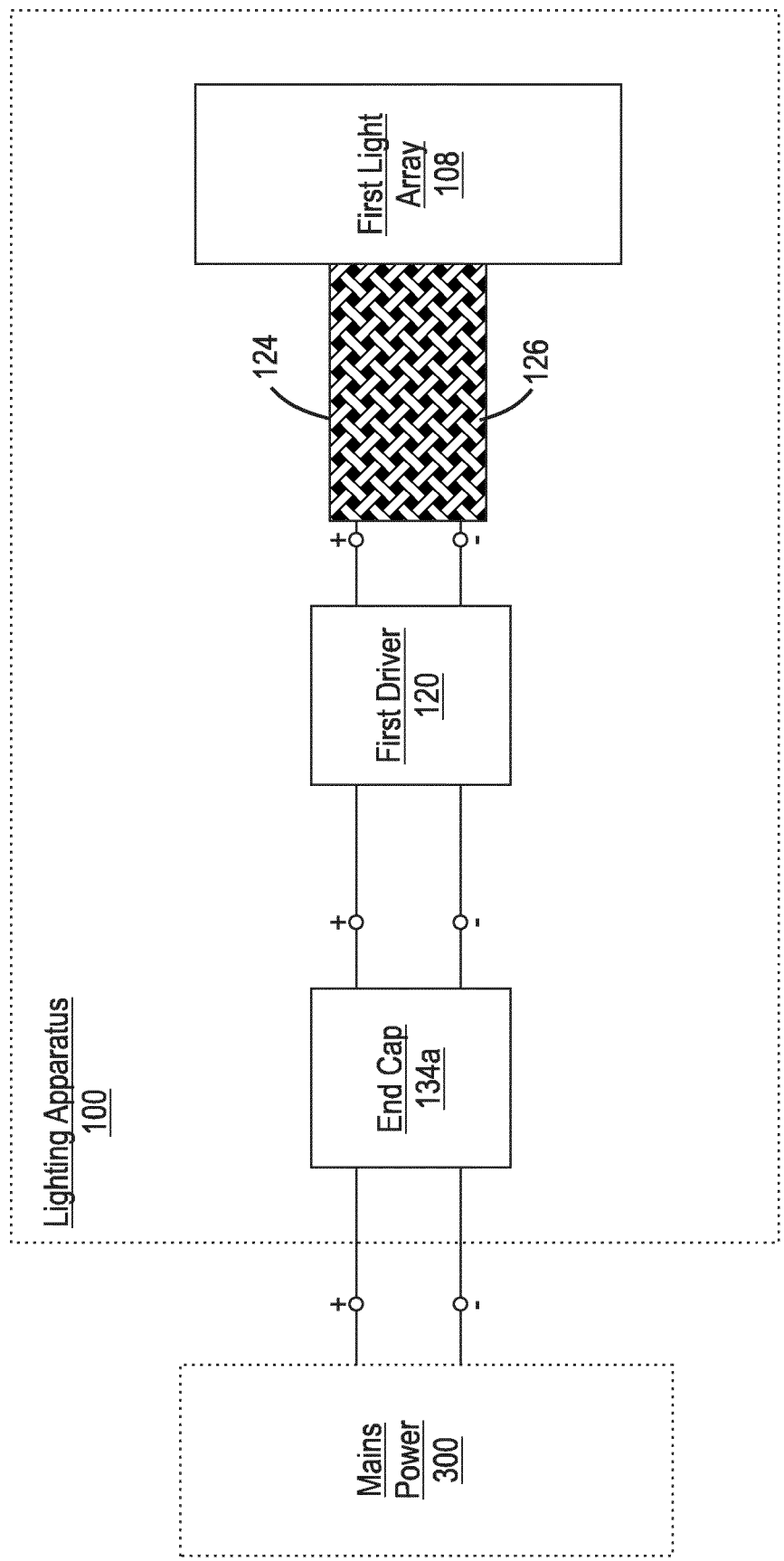
FIG. 5 is a circuit schematic of a lighting apparatus, in accordance with an example.

FIG. 5 shows a circuit schematic of the lighting apparatus 100 illustrating how the first light array 108 is powered and/or controlled. In this example, the lighting apparatus 100 is connected to mains power 300 of the building, such as a power outlet or a hardwired luminaire fixture connection. The mains power 300 is provided to end cap 134a, which in turn provides power to first driver 120. The first driver 120 is electrically coupled to the first light array via a driver cable 124 covered with braided-shielding 126, such as glass shielding. The first driver 120 can receive signals from other aspects of the lighting apparatus to determine one or more properties of the LEDs 136 (not shown) of the first light array 108, such as on/off status, brightness, etc. The first driver 120 converts this information into a driver signal conveyed to the first light array 108 via the driver cable 124 to operate the LEDs 136 accordingly. The second light array 110 may be powered and/or controlled in an analogous manner to the arrangement shown in FIG. 5.

Figure 6A:
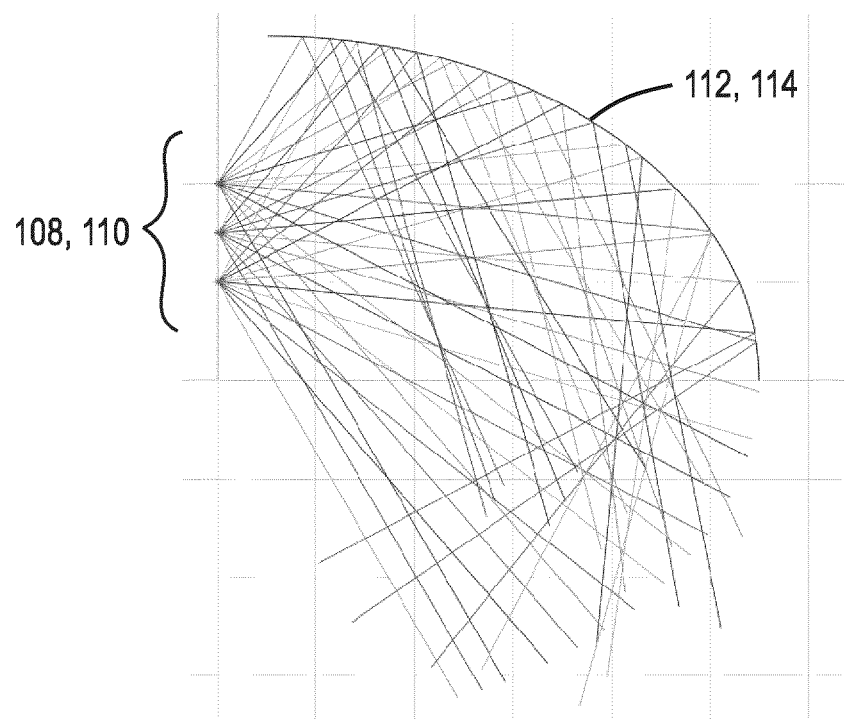
FIGS. 6A and 6B are ray-tracing diagrams of an elliptical reflector and a circular reflector, respectively, in accordance with an example.
Figure 6B:
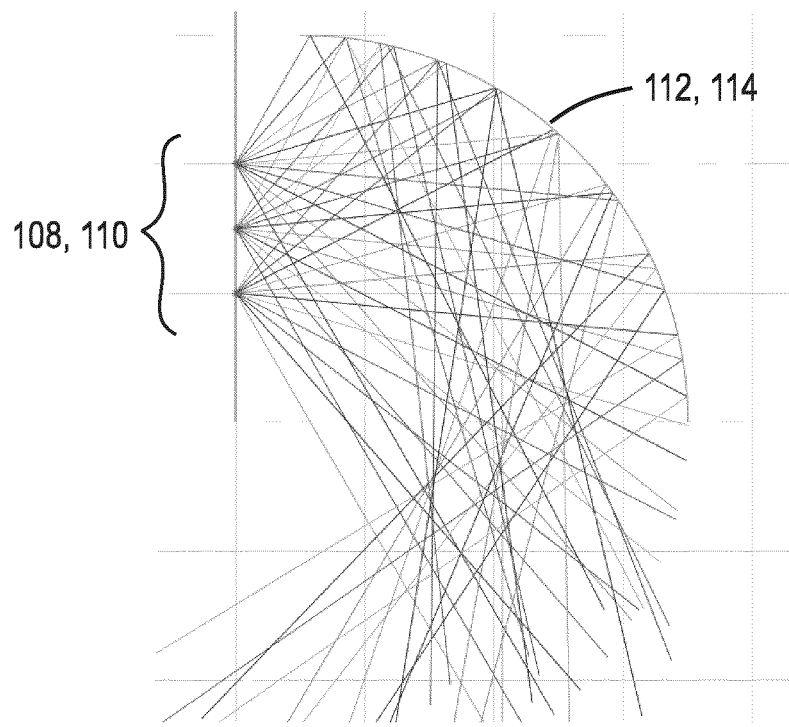

FIGS. 6A and 6B show ray-tracing diagrams of an elliptical reflector and a circular reflector, respectively. As shown, the first reflector 112 and the second reflector 114 may be elliptical or circular depending on the application. The reflector 112, 114 reflects the light generated by the first light array 108 or the second light array 110 as shown in FIGS. 6A and 6B. Other reflector shapes may be implemented in certain applications.

Figure 7:
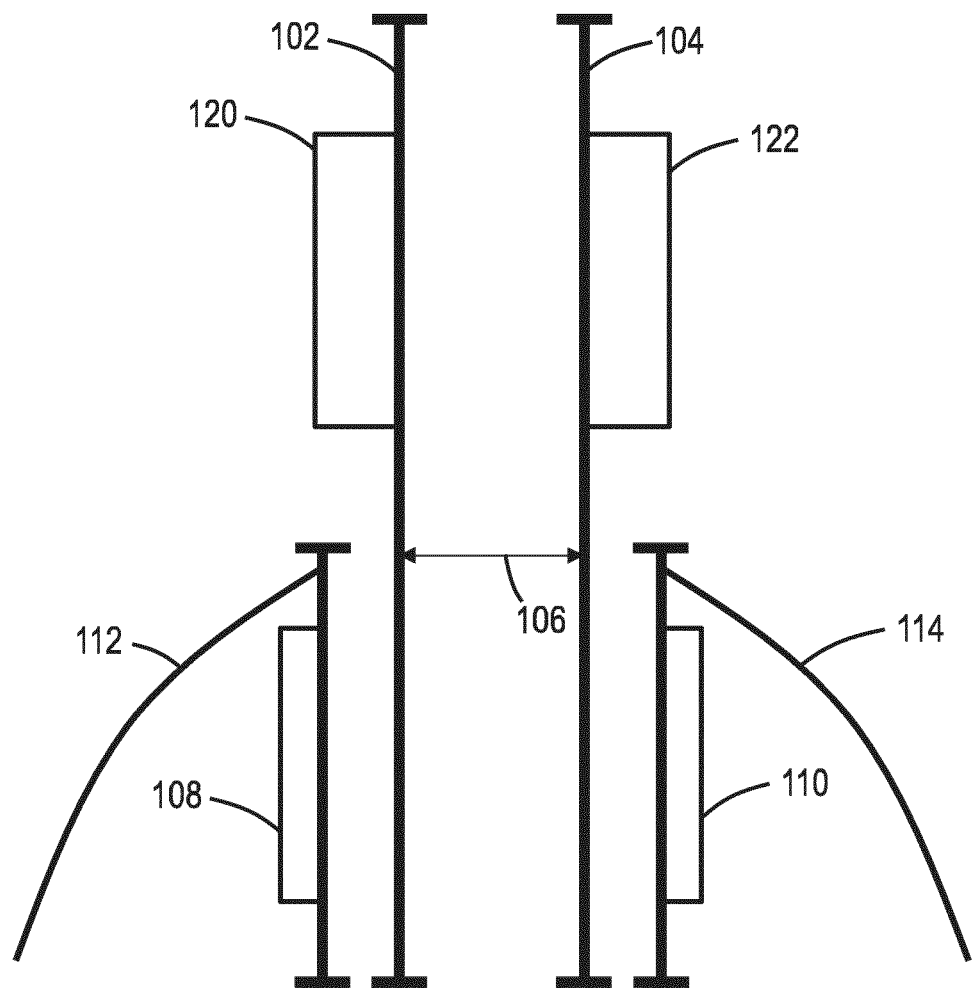
FIG. 7 is a simplified cross-sectional view of a lighting apparatus, in accordance with an example.
Figure 7:
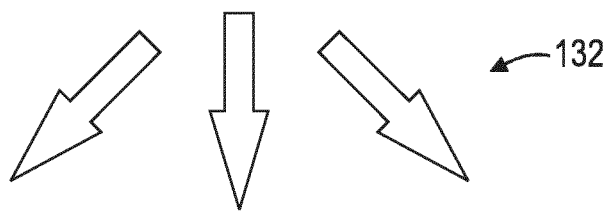

FIG. 7 shows a simplified cross-sectional view of an alternative lighting apparatus 300, in accordance with an example. This lighting apparatus is a variation of the lighting apparatus of FIG. 2, in that the drivers 120, 122 are arranged on the parallel vertical plates 102, 104, while the light arrays 108, 110 and reflectors 112, 114 are arranged on light plates 144, 146. More specifically, first driver 120 is arranged on first vertical plate 102, and second driver 122 is arranged on second vertical plate 104. The first vertical plate 102 and the second vertical plate 104 are arranged in parallel to each other, and are separated by an optimized distance 106. First light array 108 is arranged on first light plate 144, and second light array 110 is arranged on second light plate 146. First reflector 112 is arranged on the first light plate 144 around the first light array 108. Similarly, second reflector 114 is arranged on the second light plate 146 around the second light array 110. The reflectors 112, 114 are configured to reflect light 132 downwards towards ground 200.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects may be implemented using hardware, software or a combination thereof. When any aspect is implemented at least in part in software, the software code can be executed on any suitable processor or collection of processors, whether provided in a single device or computer or distributed among multiple devices/computers.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant may be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific examples described herein. It is, therefore, to be understood that the foregoing examples are presented by way of example only and that, within the scope of the appended claims and equivalents thereto, examples may be practiced otherwise than as specifically described and claimed. Examples of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The invention claimed is:

1. A lighting apparatus, comprising:
a first vertical plate arranged perpendicular to ground;
a second vertical plate arranged in parallel with the first vertical plate, wherein the second vertical plate is separated from the first vertical plate by an optimized distance;
a first light array arranged on an exterior side of the first vertical plate;
a second light array arranged on an exterior side of the second vertical plate;
a first reflector arranged around the first light array; and
a second reflector arranged around the second light array;
a first driver plate arranged in parallel on the exterior side of the first vertical plate;
a second driver plate arranged in parallel on the exterior side of the second vertical plate;
a first driver arranged on the first driver plate, wherein the first driver is electrically coupled to the first light array; and
a second driver arranged on the second driver plate, wherein the second driver is electrically coupled to the second light array.

2. The lighting apparatus of claim 1, wherein the first driver is electrically coupled to the first light array via one or more driver cables.

3. The lighting apparatus of claim 2, wherein the one or more driver cables are covered by braided-shielding.

4. The lighting apparatus of claim 1, wherein the first light array is arranged on a first side of the first vertical plate, wherein the first side faces away from the second vertical plate.

5. The lighting apparatus of claim 1, wherein the second light array is arranged on a first side of the second vertical plate, wherein the first side faces away from the first vertical plate.

6. The lighting apparatus of claim 1, wherein the optimized distance between the first vertical plate and second vertical plate optimizes free convection within the lighting apparatus when the lighting apparatus has a temperature between 45° Celsius and 65° Celsius.

7. The lighting apparatus of claim 1, wherein the optimized distance is approximately 1.5 cm, (0.6 inches).

8. The lighting apparatus of claim 1, wherein the first light array and the second light array emit between 8,000 and 72,000 lumens in total.

9. The lighting apparatus of claim 1, wherein the first vertical plate and the second vertical plate are each approximately 0.61 meters, (2 feet) long.

10. The lighting apparatus of claim 1, wherein the first light array and the second light array generate approximately equivalent quantities of visible light.

11. The lighting apparatus of claim 1, wherein the first reflector is configured to direct at least a portion of light generated by the first light array toward the ground.

12. The lighting apparatus of claim 1, wherein the first reflector and the second reflector are circular or elliptical.

13. The lighting apparatus of claim 1, wherein the first vertical plate and the second vertical plate are steel.

* * * * *